United States Patent [19]

Kakuhashi et al.

[11] 4,220,945
[45] Sep. 2, 1980

[54] PRINTED CIRCUIT SUBSTRATE WITH RESISTANCE COAT

[75] Inventors: Takeshi Kakuhashi; Yasufumi Miyake, both of Ibaraki, Japan

[73] Assignee: Nitto Electric Industrial Co., Ltd., Ibaraki, Japan

[21] Appl. No.: 884,296

[22] Filed: Mar. 7, 1978

[30] Foreign Application Priority Data

Nov. 21, 1977 [JP] Japan .................. 52-140525

[51] Int. Cl.$^2$ .............................................. H01C 7/18
[52] U.S. Cl. ............................ 338/308; 338/314; 338/327; 338/328
[58] Field of Search ............... 338/308, 314, 327, 328; 252/513, 518; 75/175 R, 170

[56] References Cited

U.S. PATENT DOCUMENTS

| | | | |
|---|---|---|---|
| 859,608 | 7/1907 | Marsh | 75/170 |
| 2,632,831 | 3/1953 | Pritikin | 338/308 X |
| 2,662,957 | 12/1953 | Eisler | 219/553 X |
| 2,803,729 | 8/1957 | Kohring | 338/308 X |
| 3,337,426 | 8/1967 | Celto | 338/308 |
| 3,396,055 | 8/1968 | Hedden | 338/308 X |
| 3,522,085 | 7/1970 | Watanabe | 338/328 X |
| 3,808,576 | 4/1974 | Castonguay | 338/308 X |
| 4,017,712 | 4/1977 | Baraff | 338/308 X |
| 4,038,457 | 7/1977 | Kinugasa | 338/308 X |

OTHER PUBLICATIONS

Tin Research Institute, Equilibrium Data For Tin Alloys, Sep. 1949, Middlesex, Great Britain, pp. 38 & 39.
Cuthbertson, J. W., Developments in the Metallurgy of Tin and its Alloys, Metallurgia, Dec. 1953, p. 281.
Black, George, Electroplated Coatings in the Materials & Methods Manual, #38 of Jun. 1948, p. 95.

*Primary Examiner*—Richard R. Kucia
*Attorney, Agent, or Firm*—Sughrue, Rothwell, Mion, Zinn and Macpeak

[57] ABSTRACT

A printed circuit substrate with a resistance coat comprises an insulating support having provided at least on the one side thereof a highly conductive material layer interposed with a resistance coat. The resistance coat comprises tin-nickel alloy.

7 Claims, 1 Drawing Figure

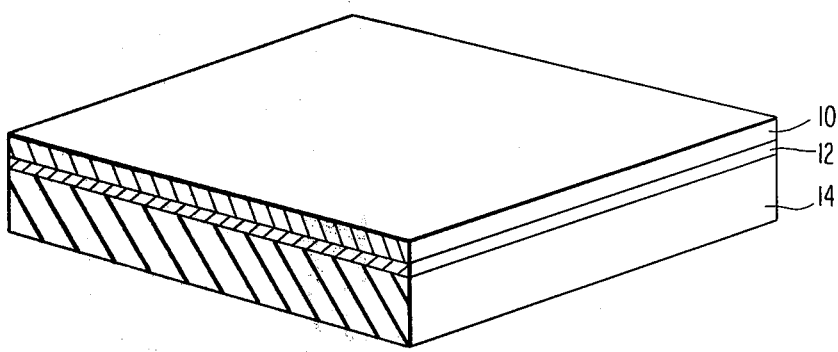

PRINTED CIRCUIT SUBSTRATE WITH RESISTANCE COAT

BACKGROUND OF THE INVENTION

This invention relates to a printed circuit substrate with a resistance coat which is useful for manufacturing a printed circuit board with resistance elements.

Printed circuit substrates containing a resistance coat are generally provided in the form of laminates comprising an insulating support having joined thereto a resistance material layer and a highly conductive material layer like copper foil joined to said resistance material layer and, upon production of printed circuit board with resistance elements, insulating areas (where all layers on the support are removed), resistance areas (where the highly conductive layer is removed) and conductive areas (where no layers are removed) are formed according to intended circuit patterns through a substractive process (mask-etching process). Carbon series resistance materials are generally used as the resistance materials in printed circuit technical field but, recently, there has been suggested the use of electroplated nickel containing phosphorus (Japanese Patent Laid-Open No. 73762/73) corresponding to U.S. Pat. No. 3,808,576 or the use of various binary alloys (Japanese Patent Laid-Open No. 71513/75) corresponding to U.S. Pat. No. 3,857,683 which are plated. However, the metal or the alloys suggested in the above publications have been found to involve various problems in characteristics and workability as resistance materials for use in a printed circuit substrate with resistance coat.

With this type of thin metal resistance coat, coat with high sheet resistance can be obtained by reducing the thickness thereof but, in general, microscopic uniformity of the thin metal coat, so-called levelling, would be substantially sacrificed with reduction of coat thickness. Thus, there exists a limit to the coat thickness for obtaining a stable sheet resistance. For example, with the electroplated coat of nickel-phosphorus which is at present being industrially employed, the thickness of about several hundred Å is the limit, which provides the sheet resistance of about 100 $\Omega/\square$. It is difficult to otain coats with higher sheet resistance.

On the other hand, the metal coat to be used as a thin metal resistance coat is particularly desired to be uniform over all the layer of highly conductive material like copper foil. This macroscopic uniformity of the metal coat, or so-called uniform electrodeposition property, is not so good with the above-described nickel-phosphorus electroplated coat. The thickness of the coat at the peripheral area of the copper foil is greater than that at the central area, and hence sheet resistance at the peripheral area becomes lower than that at the central area, resulting in an effective area with substantially uniform sheet resistance being as low as 40–60%. Thus, the above-described coat has serious defects in the cost of materials and in production.

Further, the resistance coat comprising this electroplated coat has a serious defect in the processing step for forming a printed circuit board with resistance elements from a printed circuit substrate according to a subtractive process. Circuit boards with resistance elements are manufactured from this type of printed circuit substrate via the processing steps as follows.

The copper foil surface of said substrate is covered with a photoresist, exposed through a photographic negative with a combination of a conductor pattern and a resistance pattern (i.e., having a pattern corresponding to conductor area and a pattern corresponding to resistance area), and developed to leave the resist in this pattern area, followed by etching away the copper foil at the area not covered with the resist, and then etching away the uncovered resistance coat with an exclusive etching solution to lay bare an insulating support lying thereunder. Then, the remaining resist is washed away using a stripping solution. After covering with another photoresist, it is exposed through a photographic negative with a conductor pattern, and developed to leave the resist in the conductor pattern area, followed by etching away copper foil at the area not covered with the resist (in the shape in conformity with the resistance pattern area). Thus, the surface of the resistance coat corresponding to the resistance pattern area is laid bore. Then, the remaining resist is washed away using a stripping solution to obtain a circuit board with resistance elements.

In the above-described process, it is necessary that the material to be used for the resistance coat be stable enough against the etching solution not to be etched at all or to be scarcely etched, said etching solution being used for etching away the copper foil in the form corresponding to the resistance pattern area.

Generally, etching selectivity between the above-described nickel-phosphorus coat and a copper foil which is the most popular as a highly conductive material layer is so poor that, upon etching the copper foil, the nickel-phosphorus coat is partly etched from the surface to greatly increase the resistance value thereof. Thus, the resistance value will exceed a desired level to make it difficult to stably produce resistance elements.

In addition, various binary alloys have been suggested as described above for the reason that plated alloy coats generally permit obtaining higher resistance values than possible with plated single metal coats. However, only the above-described nickel-phosphorus coat has been industrially employed because, as a general tendency in alloy plating, it is difficult to balance the above-described factors of uniform electrodeposition property, levelling property, etching selectivity, etc. and in addition, it is extremely difficult to stably produce a plated alloy coat with a uniform resistance value and a definite composition, which causes problems in using the plated alloy coat as a metal resistance coat, though not particularly involving problems for general uses of imparting good appearance, corrosion resistance and mechanical characteristics to steel plates, copper plates, etc.

For example, with the nickel-molybdenum alloy plating which is one of the binary alloys described in Japanese Patent Laid-Open No. 71513/75, composition of the plated alloy coat obtained from a plating bath having a nickel-molybdenum bath composition of 1/1 (Mo/Ni atomic ratio; 0.25 mol/l of nickel chloride and 0.25 mol/l of sodium molybdate) is about 0.15/1 (Mo/Ni atomic ratio) over a wide range of electric current density, i.e., the composition is inclined toward a low molybdenum content side. Therefore, the plating bath composition changes with the plating time. That is, it is substantially difficult to conduct plating with a stable coating composition over a long period of time.

With plated coats for which high performances are required like resistance elements, it must be taken into consideration that variation in the thickness of plated coats and variation in composition exert subtle influences on the characteristics thereof. With the other binary alloy compositions described in the aforesaid publication, stable production of plated alloy coats with definite compositions using those binary systems is extremely difficult, though numerical values of individual compositions are not given here.

SUMMARY OF THE INVENTION

As a result of various investigations for removing the above-described technical defects and difficulties, the inventors have discovered the surprising fact that remarkable characteristics in uniform electrodepositing property, leveling property, etching selectivity, stability of plated alloy composition, etc. as a resistance element of a metal coat can be obtained by using tin-nickel alloy as a resistance coating material.

BRIEF DESCRIPTION OF THE DRAWING

The single FIGURE illustrates a printed circuit substrate according to the present invention having a conductive layer 10, resistance coat 12 and insulating support 14.

DETAILED DESCRIPTION OF THE INVENTION

In the case of providing the higly conductive material layer like copper foil by plating tin-nickel alloy, there is the greatly different aspect from the case of plating other alloys that change in the ratio of concentrations of metal ions in a plating bath scarcely influences the composition of the resulting plated alloy coat. As is described above, composition of plated alloy coat generally undergoes change since an anode does not provide enough amount of metal ions to compensate for the change in concentration ratio of metal ions in the bath caused by a long-term plating.

With tin-nickel alloy plating, a plated coat having the composition almost corresponding to an equivalent atom composition of tin and nickel can be obtained over an extremely wide range of the plating bath composition. Since the atomic weights of tin and nickel are 118.7 and 58.7, respectively, the weight ratios in the plated alloy can be maintained at about 67% (64–70%) and about 33% (30–36%), respectively. The composition of substantially equivalent atom contents can easily be obtained, in particular, in a so-called fluoride bath containing sodium fluoride, acid ammonium fluoride, etc. This is attributed to the fact that plating proceeds via formation of a complex salt, $NiSnF_xCl_y$.

Also, as a comparatively new type, a pyrophosphate bath containing potassium pyrophosphate or the like can be used in place of the above-described corrosive fluoride bath in the copresence of a suitable additive agent, to thereby obtain a plated coat comprising an alloy having substantially equivalent atom contents.

As is described above, since a plated tin-nickel coat can easily be provided with a stable alloy composition, a resistance coat with a definite sheet resistance can be stably produced by adjusting the coat thickness and, in addition, the plated coat has important features indispensable as a thin metal resistance coat.

Said plated coat can be made thin. Even when the coat thickness is as thin as about 100 Å, microscopic uniformity (levelling) is not sacrificed, and there can be obtained an excellent levelling property to produce a coat having a sheet resistance as high as about 300–400 $\Omega/\square$. Of course, the coat can be made thick, usually being about 70–2000 Å. In addition, said plated coat has such a good uniform electro-deposition property that a uniform coat thickness can be attained over a wide area (substantially 75–85%) of the highly conductive material layer like copper foil, thus being extremely advantageous in material cost and processing cost.

Further, as to the etching selectivity with copper which is the most common as a highly conductive material, the alloy coat has a remarkably high selectivity for various etching solutions.

For example, in processing printed circuit substrates containing copper foil as the highly conductive material layer and nickel-phosphorus alloy coat as the resistance coat which are at present industrially used, etching for a longer time than a proper etching time by 50% using an ammonia chelate series etching solution (e.g., Neutra-Etch V-1, made by Shiply company Inc.) results in increase of a resistance to 28 $\Omega/\square$ where 25 $\Omega/\square$ is a proper sheet resistance of plated nickel-phosphorus coat (increase by 11%) or to 125 $\Omega/\square$ (increase by 25%). This is due to the fact that uncovered nickel-phosphorus coat suffers corrosion by the etching solution for etching copper from the surface of the nickel-phosphorus coat. This causes variation in resistance value and reduction in yield rate. With a chromic acid-sulfuric acid series etching solution, an increase in resistance value is controlled to some extent, but essential defects cannot be avoided. In addition, from the point of view of preventing environmental pollution, it is desired that the use of this etching solution be avoided as much as possible.

With the plated tin-nickel alloy coat used in the present invention, an increase in sheet resistance can be held to about 1–2% even when the coat of 20–450 $\Omega/\square$ in sheet resistance is etched with an ammonia chelate series etching solution for a period two times as long as a proper copper-etching time. Thus, production of inferior products due to the increase in resistance value in the processing step can be substantially avoided.

The printed circuit substrate with the resistance coat in accordance with the present invention can be produced, for example, as follows. First, one side of a highly conductive material layer is wholly covered with an adhesive sheet, an ink or the like for masking, and the tin-nickel alloy coat thus far described is plated on the other side as a resistive coat. Then, the masking covering is removed, and an insulating support is joined onto the resistance coat side by heat adhesion, using an adhesive or the like to obtain the substrate. Formation of a printed circuit board with resistance elements from this circuit substrate is completed by processing according to the conventional manner already described above and, after formation of circuit, covering, if necessary, the surface of the resistance coat in the resistance pattern area with a liquid or filmy cover coat.

As the highly conductive material layer constituting the printed circuit substrate of the present invention with the resistance coat, there can be used an aluminum foil, a tin-plated copper foil, a zinc foil, a silver foil, etc, as well as a copper foil.

The most important feature of the present invention is that the resistance coat is composed of tin-nickel alloy. This alloy is provided on the highly conductive material layer through an essentially plating process. The tin-nickel alloy plating is conducted according to a chemical plating method using hydrazine hydrate or sodium hypophosphite, etc. as a reducing agent, or according to an electro plating method from a fluoride bath using sodium fluoride, acid ammonium fluoride, etc. or a pyrophosphate bath using stannous pyrophosphate or sodium pyrophosphate etc.

As the plating method, an electroplating method is advantageous since it most easily provides the control coat thickness and composition. The pyrophosphate bath has the feature that plating composition can be changed fairly easily, whereas the fluoride bath has the feature that, as has been described, it provides the alloy composition containing substantially equivalent atom contents of tin and nickel over a wide range of plating bath composition, thus being particularly suited for forming a resistance coat required to process a strictly constant composition.

However, the pyrophosphate bath is preferred since it provides, in the presence of a suitable additive agent, a plated coat having substantially equivalent atom contents over a wide range of bath composition as with the fluoride bath and since it is not corrosive as compared with the fluoride bath.

As to the composition ratio of tin to nickel in the alloy, an alloy containing 50-85% by weight of tin is preferred since it provides good characteristics as a resistant coat, provides good results as to uniform electrodeposition property and levelling property, and possesses high etching selectivity with copper foil or the like. In particular, alloy compositions containing tin and nickel in substantially equivalent atomic ratio, i.e., alloy compositions containing 64-70% by weight of tin, is preferred since resistance values can be easily controlled in addition to the above-described reasons and, therefore, a resistance coat with a definite sheet resistance can be stably produced.

As the insulating support, there can be used laminates such as an epoxy resin-glass cloth, a polyester-glass cloth, a polyimide-glass cloth, a polyamidoimide-glass cloth, a phenol resin-paper and an epoxy resin-paper, flexible insulating sheets or films of polyimide, polyester, polyamidoimide, flexible epoxy resin-glass cloth, flexible polyamide-paper, etc., and those obtained by joining an aluminum or iron plate as a heat sink onto the above-described various insulating laminates, sheets or films (onto the surface opposite to the side on which a resistance coat is to be provided).

In addition, as the insulating support, inorganic materials such as a ceramics plate or a glass plate having provided thereon an adhesive layer of a resin or rubber such as epoxy resin, polyester, polyurethane, polyamidoimide, polyimide, rubber, etc. can also be used.

In the above description, the present invention has been illustrated only referring to the structure wherein the resistance coat and the highly conductive material layer are provided on the one side of the insulating support, for the sake of simplicity. However, the substrate of the present invention for forming a printed circuit board with resistance elements may be structurally improved or modified. For example, it includes the structure wherein the resistance coat and the highly conductive material layer are provided on both sides of the insulating support, and the structure wherein the resistance coat and the highly conductive material layer are provided on the one side of the insulating support and a highly conductive material layer (for forming a conductor or electrode by etching or the like) on the other side.

In the processing of the printed circuit substrate with the resistance coat of the present invention to a printed circuit board with resistance elements, known etching solutions can be used as an etching solution for the highly conductive material layer. For example, when copper foil is used, ferric chloride, ammonium persulfate, cupric chloride, a chromic acid-sulfuric acid mixture solution, an ammonium chelate series etching solution, etc. can be used. The tin-nickel alloy coat as the resistance coat is so stable against these common etching solutions that it scarcely suffers an increase or change in resistance value due to etching.

In addition, etching processing for forming resistance elements from the tin-nickel alloy coat as a resistance coat are conducted, for example, by immersing it first in the following solution (A) then in the following solution (B), though not being limitative at all. In some cases, etching never proceeds by immersing in this order. In such cases, etching can be effected by immersing first in solution (B), then in solution (A). The reason for this is not known in detail, but it is believed that this phenomenon relates to the component composition and the structure of the tin-nickel alloy coat.

Etching solution (A): 35% hydrochloric acid aqueous solution

| Etching solution (B) | |
|---|---|
| Formulation | |
| 95% H$_2$SO$_4$ | 10.0 l |
| 60% HNO$_3$ | 540 ml |
| Water | 6.0 l |

DESCRIPTION OF THE PREFERRED EMBODIMENTS

The present invention will now be illustrated in more detail by the following examples of preferred embodiments of the present invention, which however do not limit the present invention in any way.

EXAMPLE 1

35μ-thick copper foil was cut into pieces of given dimension (18×15 cm) and, after immersing them for 3 minutes in a cleaning solution (a solution prepared by diluting 1 volume of a concentrated solution of Neutra-Clean 68 made by Shiply Company Inc. with 1 volume of water; temperature: 40° C.), they were rinsed with water, immersed for 3 minutes in a 10% sulfuric acid aqueous solution, rinsed with water, and dried. One side of each of the copper foil pieces was covered with an adhesive sheet for masking (SPV No. 224, made by Nitto Electric Industrial Co., Ltd.), immersed for 3 minutes in a 20% hydrochloric acid aqueous solution and, after rinsing with deionized water, subjected to electroplating under the conditions shown in Table 1 using fluoride series plating bath I, II or III shown in the table.

Table 1

| | | I | II | III |
|---|---|---|---|---|
| Plating Bath Composition | SnCl$_2$ 2H$_2$O | 48.0 g/l | 48.0 g/l | 48.0 g/l |
| | NiCl$_2$ 6H$_2$O | 150.0 g/l | 200.0 g/l | 300.0 g/l |
| | NaF | 28.0 g/l | 28.0 g/l | 28.0 g/l |
| | NH$_4$HF$_2$ | 35.0 g/l | 35.0 g/l | 35.0 g/l |
| | 28% Aqueous ammonia | in a slight amount (for adjusting PH) | in a slight amount (for adjusting PH) | in a slight amount (for adjusting PH) |
| Plating Condi- | Temperature | 65° C. | 65° C. | 65° C. |

Table 1-continued

| | | I | II | III |
|---|---|---|---|---|
| tions | PH | 3.0 (25°C.) | 3.0 (25° C.) | 3.0 (25° C.) |
| | Current Density | 0.14 A/dm² | 0.14 A/dm² | 0.14 A/dm² |
| | Stirring | no | no | no |
| | Anode | Ni plate | Ni plate | Ni plate |

Plating was conducted three times changing the plating time to 125 seconds, 200 seconds and 300 seconds with each plating bath (see Table 3) and, after the electrodeposition, the copper foil pieces were taken out, and the masking adhesive sheet was removed, followed by rinsing and drying them.

In the above plating procedures, there was observed the tendency that the thickness of the plated coat at the peripheral area of the copper foil piece was partly thicker than in the central area, resulting in reduction in sheet resistance. However, in this example using each of the aforesaid plating baths, uniform electrodeposition property was good, and the effective area as a resistance coat was about 80%.

Then, effective portions of the plated copper foil pieces were cut out, and an epoxy resin-impregnated glass cloth (popularly called prepreg) was superposed on the resistance coat side of the copper foil pieces, and joined to each other by heat-pressing using a press for lamination to obtain printed circuit substrates with resistance coat.

Each of the thus obtained printed circuit substrates was processed in the already described manner to form a printed circuit board with resistance elements.

Conditions of etching the copper foil and the resistance coat were as follows.

Conditions for etching copper foil:
Etching solution: Neutra-Etch V-1 made by Shiply Company Inc.
Temperature: 52° C.
PH: 7.5 (25° C.)
Time: 3 minutes (thickness of the copper foil: 35μ)

Conditions for etching the resistance coat (immersing in 25° C. solution (A), then in 25° C. solution (B):

Etching solution (A): 35% hydrochloric acid aqueous solution

| Etching solution (B) | |
|---|---|
| Formulation | |
| 95% H₂SO₄ | 10.0 l |
| 60% HNO₃ | 540 ml |
| Water | 6.0 l |

Time: shown in Table 2

Table 2

| | Resistance Coat | Solution (A) | Solution (B) |
|---|---|---|---|
| Plating Time | for 125 sec. | 3 min. | 2 min. |
| | for 200 sec. | 5 min. | 3 min. |
| | for 340 sec. | 10 min. | 6 min. |

A second copper foil etching (etching copper foil corresponding to resistance pattern area) was conducted under the same conditions as the above-described copper foil etching. In this case, excess etching scarcely etched the underlying resistance coat. Therefore, there was not observed an increase in sheet resistance due to excess etching. Thus, etching selectively was demonstrated to be extremely good.

For example, where a proper etching time was 3 minutes, sheet resistance increased by only 1-2% when etching was deliberately excessively conducted for 6 minutes.

After the second etching of the copper foil pieces, they were sufficiently rinsed with water and dried. A solder stop-off was applied to the resistance area by screen printing, then subjected to heating to harden, thus completing printed circuit boards with resistance elements.

Resistance characteristics of these printed circuit boards with resistance elements are tabulated in Table 3 corresponding to the aforesaid plating conditions.

Table 3

| Item | I | | | II | | | III | | |
|---|---|---|---|---|---|---|---|---|---|
| Plating Time (sec) | 125 | 200 | 340 | 125 | 300 | 340 | 125 | 200 | 340 |
| Composition of Resistance Coat (tin % by weight) | 66.5 | 66.8 | 66.5 | 65.4 | 65.4 | 65.3 | 65.2 | 64.9 | 65.3 |
| Sheet Resistance (Ω/□) (variation in sheet resistance) (%) | 400 (±7) | 200 (±5) | 100 (±3) | 400 (±7) | 200 (±5) | 100 (±3) | 380 (±7) | 195 (±5) | 100 (±3) |
| *1 | <+150 | <+80 | <+50 | <+150 | <+80 | <+50 | <+150 | <+80 | <+50 |
| *2 | <+0.7 | <+0.7 | <+0.7 | <+0.7 | <+0.7 | <+0.7 | <+0.7 | <+0.7 | <+0.5 |
| *3 | <+1.0 | <+0.7 | <+0.3 | <+1.0 | <+0.7 | <+0.3 | <+1.0 | <+0.7 | <+0.3 |

*1: Temperature coefficient of resistance (PPM/°C.) (Temperature range: −65° to 125° C.)
*2: Humidity-resistance (%) (40° C. relative humidity: 95%: rate of change in resistance after 240 hrs under no load)
*3: Heat resistance in solder (%) (rate of change in resistance after immersing in a 260° C. solder for 20 seconds)

Additionally, the tin content of the resistance coat compositions in the above table was indicated as a value obtained by immersing the plated copper foil in the aforesaid etching solutions (A) and (B) for the resistance coat to dissolve the resistance coat (tin-nickel alloy plated coat), and analyzing the contents of tin and nickel according to the atomic-absorption spectroscopy.

As is clear from Table 3, three plating baths (I, II, III) having a different plating bath compositions provided extremely approximate compositions of plated alloy costs (resistance coats) and alloy compositions with substantially equivalent atomic ratios. Thus, it is seen that the resistance coats show about the same characteristics. Also, with each plating bath, the fact that plating for 125 seconds provided a plated coat of about 100 Å in thickness with a stable sheet resistance value of as high as about 400 Ω/□ shows that such a thin thickness does not spoil the levelling property of the coat.

EXAMPLE 2

Printed circuit substrates were produced in the same manner as in Example 1 except for using a pyrophosphate series plating bath upon forming on the one side of copper foil a tin-nickel alloy plated coat as a resistance coat. Results obtained by producing printed circuit boards with resistance elements through further processing are shown below. In this example, the effective area of resistance coat was about 80%, uniform electrodepositing property was good, and the etching selectivity was as good as in Example 1.

Plating conditions and resistance characteristics of corresponding resistance circuits are tabulated in Table 4.

Table 4

|  |  | IV | | | V | | |
|---|---|---|---|---|---|---|---|
| Plating Bath composition | $SnCl_2 \cdot 2H_2O$ | 19.0 g/l | | | 52.8 g/l | | |
|  | $NiCl_2 \cdot 6H_2O$ | 30.0 g/l | | | 30.0 g/l | | |
|  | $K_4P_2O_7 \cdot 3H_2O$ | 200 g/l | | | 200 g/l | | |
|  | Ammonium citrate | 20 g/l | | | 20 g/l | | |
|  | 28% Aqueous ammonia | slight amount (for adjusting PH) | | | slight amount (for adjusting PH) | | |
| Plating Condition | Temperature | 50° C. | | | 50° C. | | |
|  | PH | 8.2 (25° C.) | | | 8.2 (25° C.) | | |
|  | Current density | 0.1 A/cm² | | | 0.1 A/cm² | | |
|  | Stirring | no | | | no | | |
|  | Anode | Ni plate | | | Ni Plate | | |
| Plating Time (sec) | | 70 | 140 | 300 | 70 | 140 | 300 |
| Composition of the Resistance Coat (tin % by weight) | | 65.3 | 65.8 | 65.9 | 66.2 | 66.8 | 66.8 |
| Time of Etching Resistance Coat (min.) | *1 | 3 | 4 | 7 | 2 | 4 | 7 |
|  | *2 | 2 | 3 | 3 | 2 | 3 | 3 |
|  | *3 | 300 (±5) | 150 (±4) | 50 (±4) | 300 (±5) | 150 (±4) | 50 (±4) |
|  | *4 | <+70 | <+40 | <+40 | <+70 | <+40 | <+40 |
|  | *5 | <+0.7 | <+0.4 | <+0.4 | <+0.7 | <+0.4 | <+0.4 |
|  | *6 | <+0.7 | <+0.3 | <+0.3 | <+0.7 | <+0.3 | <+0.3 |

*1 Solution (A)
*2 Solution (B)
*3 Sheet resistance (Ω/□) (variation in sheet resistance) (%)
*4 Temperature coefficient of resistance (PPM/°C.) (Temperature range: −65° to +125° C.)
*5 Humidity resistance (%) (40° C.: relative humidity 95%: rate of change in resistance after 240 hours under no load)
*6 Heat resistance in solder (%) (rate of change in resistance after immersing in a 260° C. solder bath for 20 seconds)

Although the invention has been described in detail with particular reference to certain typical embodiments thereof, it will be understood that variations and modifications can be effected within the spirit and scope of the invention as described hereinabove and as defined in the appended claims.

What is claimed is:

1. A printed circuit substrate with a resistance coat, comprising an insulating support having provided at least on one side thereof a plated resistance coat of a tin-nickel alloy consisting essentially of about 50–85% by weight tin and about 15–50% by weight nickel, and further comprising a highly conductive material layer disposed over said resistance coat.

2. The printed circuit substrate as recited in claim 1, wherein said resistance coat comprises a tin-nickel alloy containing 64 to 70% by weight tin.

3. The printed circuit substrate as recited in claim 1, wherein said resistance coat is applied by electroplating or chemical plating.

4. The printed circuit substrate as recited in claim 1, wherein the thickness of said resistance coat comprising tin-nickel alloy is in a range of about 70 to 2000 Å.

5. The printed circuit substrate as recited in claim 1, wherein a sheet resistance of said resistance coat comprising tin-nickel alloy is in a range of about 20 to 450 ohms per square.

6. The printed circuit substrate as recited in claim 1, wherein said highly conductive material layer is copper foil.

7. The printed circuit substrate as recited in claim 1, wherein the ratio of tin content to nickel content is said resistance coat is substantially the same as the ratios of their atomic weights.

* * * * *